(12) United States Patent
Wu

(10) Patent No.: US 6,652,123 B2
(45) Date of Patent: Nov. 25, 2003

(54) LIGHT EMITTING DIODE DISPLAY HAVING HEAT SINKING CIRCUIT RAILS

(76) Inventor: Jiahn-Chang Wu, No. 15, Lane 13, Alley 439, Her-Chiang Street, Chutung, Hsin-Chu (TW), 310

( * ) Notice: Subject to any disclaimer, the term of this patent is extended or adjusted under 35 U.S.C. 154(b) by 0 days.

(21) Appl. No.: 09/848,993

(22) Filed: May 7, 2001

(65) Prior Publication Data

US 2002/0167807 A1 Nov. 14, 2002

(51) Int. Cl.[7] ................................................. F21S 13/14
(52) U.S. Cl. ........................................ 362/252; 362/241
(58) Field of Search ................................. 362/241, 252, 362/227, 235, 237, 240, 249, 800; 200/46

(56) References Cited

U.S. PATENT DOCUMENTS

| 3,560,675 | A | * | 2/1971 | Krakinowski | 200/46 |
|---|---|---|---|---|---|
| 3,584,162 | A | * | 6/1971 | Krakinowski | 200/5 |
| 3,617,666 | A | * | 11/1971 | Braue | 200/86 |
| 4,017,848 | A | * | 4/1977 | Tannas, Jr. | 340/365 R |
| 4,254,453 | A | * | 3/1981 | Mouyard et al. | 362/240 |
| 4,729,076 | A | * | 3/1988 | Masami et al. | 362/235 |
| 5,093,768 | A | * | 3/1992 | Ohe | 362/241 |
| 5,226,723 | A | * | 7/1993 | Chen | 362/241 |
| 5,752,766 | A | * | 5/1998 | Bailey et al. | 362/250 |
| 5,793,343 | A | * | 8/1998 | Hart et al. | 345/84 |
| 5,857,767 | A | * | 1/1999 | Hochstein | 362/294 |
| 6,045,240 | A | * | 4/2000 | Hochstein | 362/294 |

* cited by examiner

Primary Examiner—Alan Cariaso
Assistant Examiner—Ismael Negron
(74) Attorney, Agent, or Firm—H. C. Lin

(57) ABSTRACT

An LED display panel are mounted with an array of LEDs on a number of metallic partitions, serving as common electrodes foil a line of LEDs as well as heat sinks. Another number of rails serve as common electrodes for another line of LEDs. The metallic partitions and the rails are orthogonal to and insulated from one another at their cross-points.

7 Claims, 9 Drawing Sheets

LIGHT EMITTING DIODE DISPLAY HAVING HEAT SINKING CIRCUIT RAILS

BACKGROUND OF THE INVENTION (1) Field of the Invention

The invention relates to light emitting diode (LED) package, particularly to a heat sinking package for a LED display panel.

(2) Brief Description of Related Art

FIG. 1 shows the top view of a prior art LED unit 100 of a display panel. A LED 10 is mounted on a first metal extension 11 of the bottom electrode of the LED 10. The top electrode (i.e. the second electrode) of the LED 10 is wire-bonded by wire 13 to the a second metal extension 12. The LED 10 and the metal extensions 11 and 12 are mounted on an insulating substrate 15. The extensions 11 and 12 are wrapped around the sides 151 and 152 respectively of the insulating substrate 15 to the backside as shown in FIG. 2 to serve as surface contacts (not shown) on a motherboard 18.

As the light intensity demand increases, the prior art LED panel encounters the problem of heat dissipation. The need for heat sinking becomes imminent.

SUMMARY OF THE INVENTION

An object of this invention is to devise a package capable of heating sinking the heat generated in a high light intensity for LED display panels. Another object of this invention is to activate a LED display by means of X-Y addressing.

These objects are achieved by mounting a number of LEDs on a metallic partition serving as a common first electrode for a line of LEDs and heat sink Another number of rails serve as common second electrode for another line of LEDs.

DETAILED DESCRIPTION OF THE INVENTION

Figure 1:
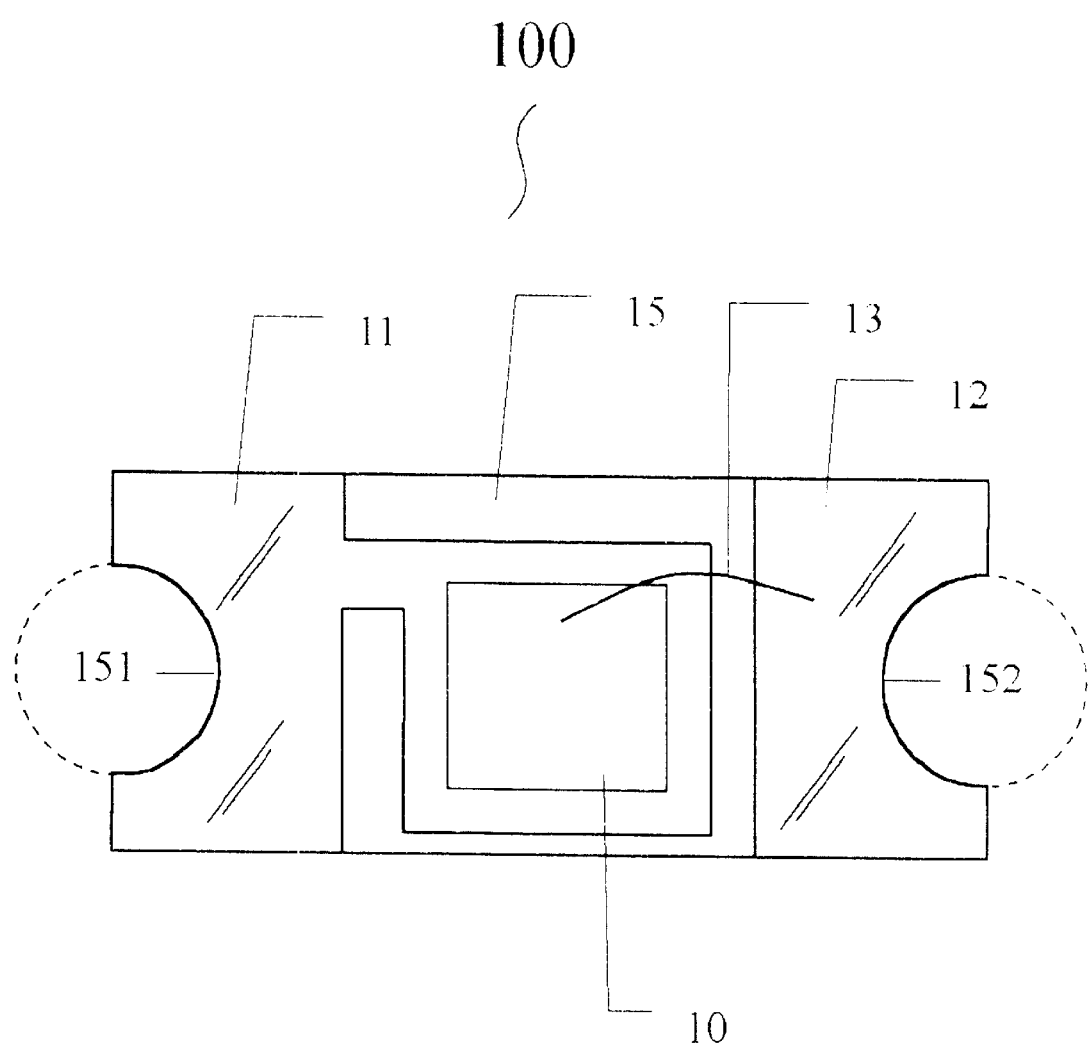
FIG. 1 shows top view of a prior art LED package for surface mounting on a motherboard.
Figure 2:
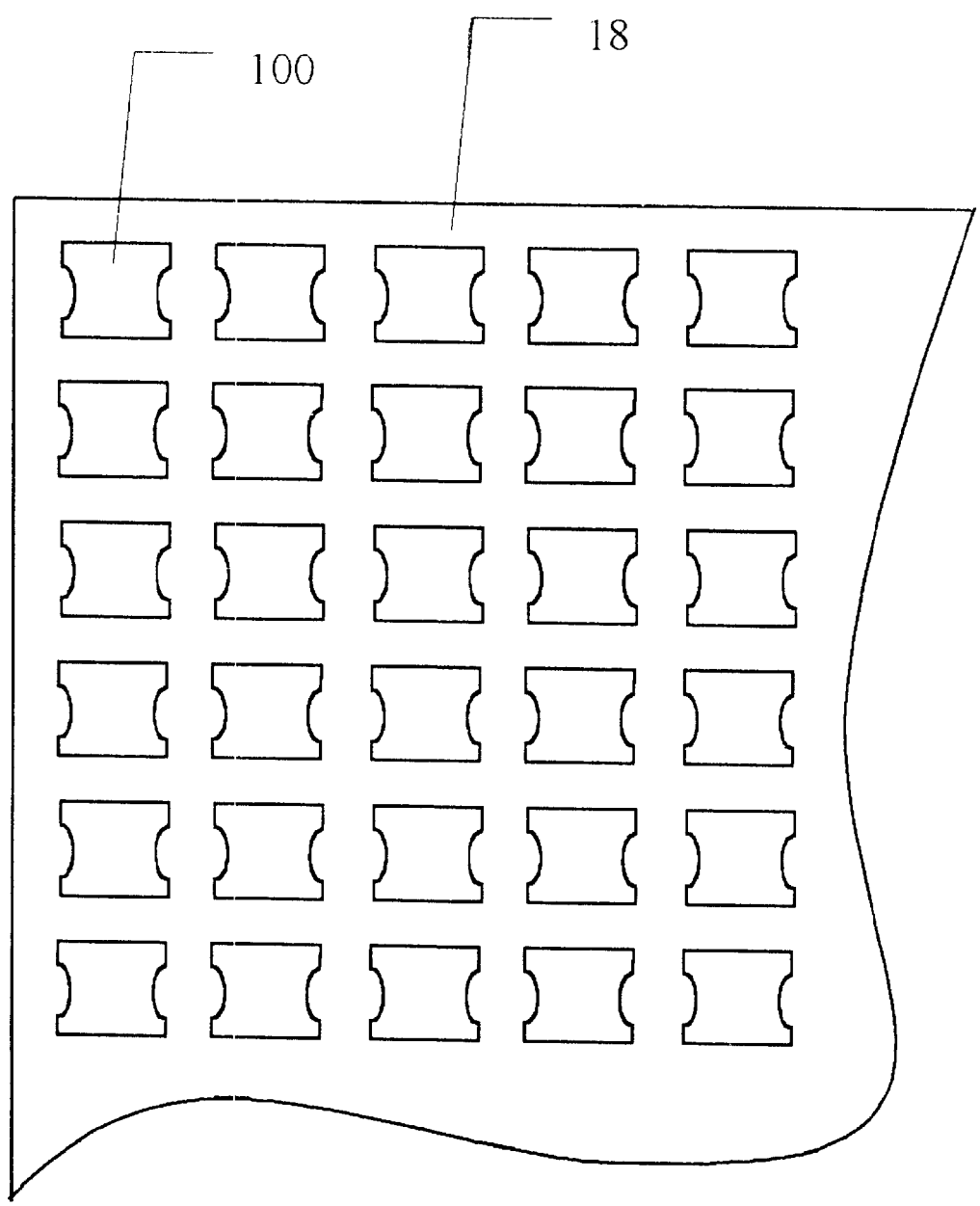
FIG. 2 shows the top view of the motherboard for a prior art LED display panel.
Figure 3:
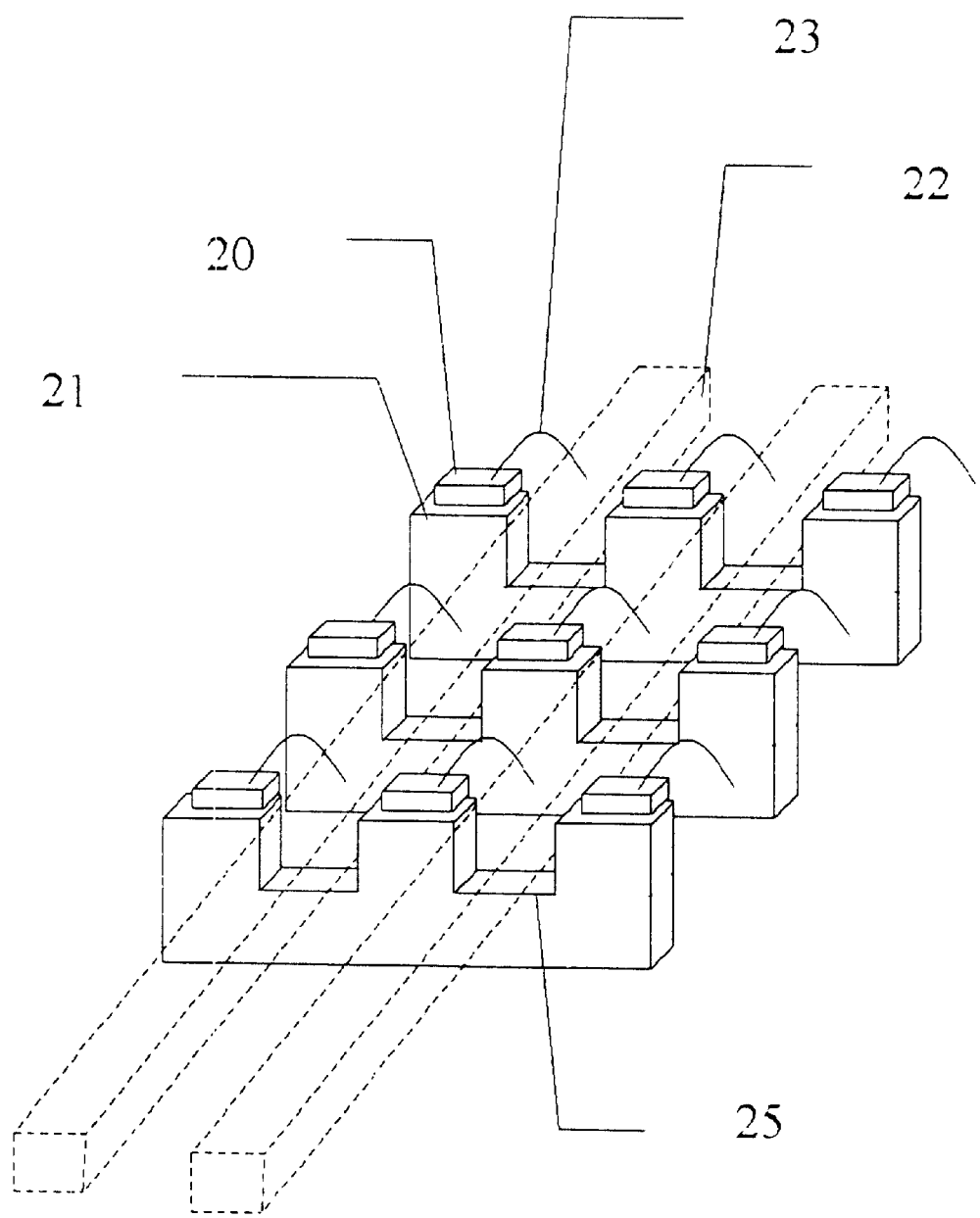
FIG. 3 shows a first embodiment of a LED display panel based on the present invention.

FIG. 3 shows a first embodiment of the present invention. A number corrugated metallic partitions 21 are lined up in parallel. The grooves 25 of the partitions 21 are aligned in a direction perpendicular to the partitions. Another set of metallic rails 22 orthogonal to the metallic partitions 21 are anchored in the grooves 25 of the partitions 21. On each pedestal of the corrugated partition 21 is mounted a LED 20. The bottom electrode of the LED 20 is in contact with the pedestal and the top electrode of the LED 20 is wire bonded by wire 23 to the metallic rail 22. Since the partitions 21 are made of conductors serving as heat sinks, the heat generated in LEDs 20 are conducted away.

Figure 4:
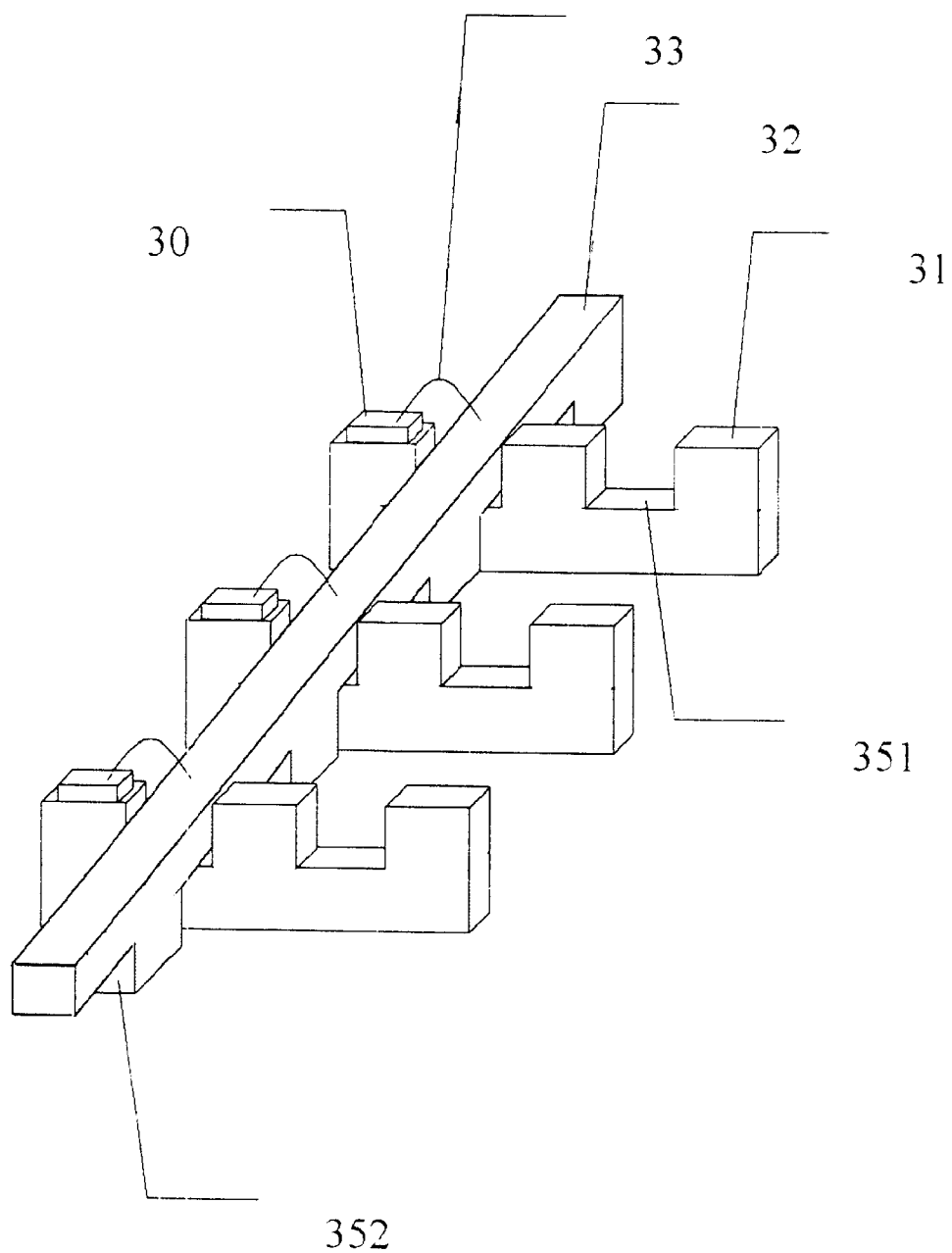
FIG. 4 shows a second embodiment of the LED display panel of the present invention.

FIG. 4 shows another embodiment of the LED package. The partitions 31 correspond to the partitions 21 in FIG. 3; the grooves 351 correspond to 25; and LEDs 30 correspond to LED 20, all serving the same functions. However, the metallic rails 33 in FIG. 4 are different from the rails 22 in FIG. 3. The runners or metallic rails 33 are corrugated in the bottom, such that the grooves of the runners 33 lock in the grooves 351 of the metal partitions 31. With such a structure, the metallic rails 33 are locked in position with respect to the metal partitions 31. Similar to FIG. 3, the LEDs 30 are mounted on the pedestals of the metal partitions 31, and the top electrodes of the LEDs are wire-bonded by wires 33 to the rails 32. The metal partitions 31 serve as heat sinks for the LEDs 30.

Figure 5:
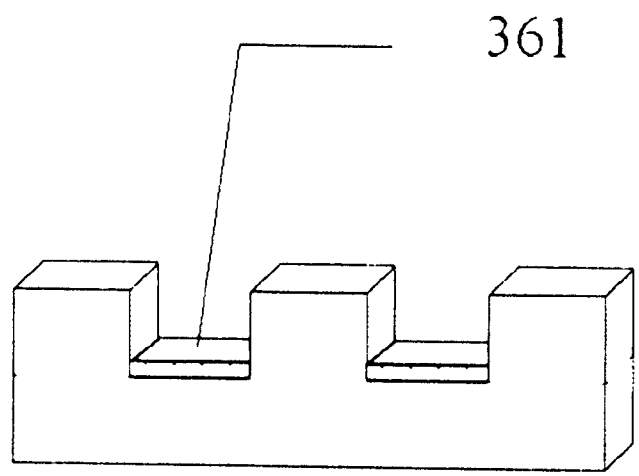
FIG. 5 shows a first version of a grooved partition for supporting the common conducting rails of the LED display panel.
Figure 6:
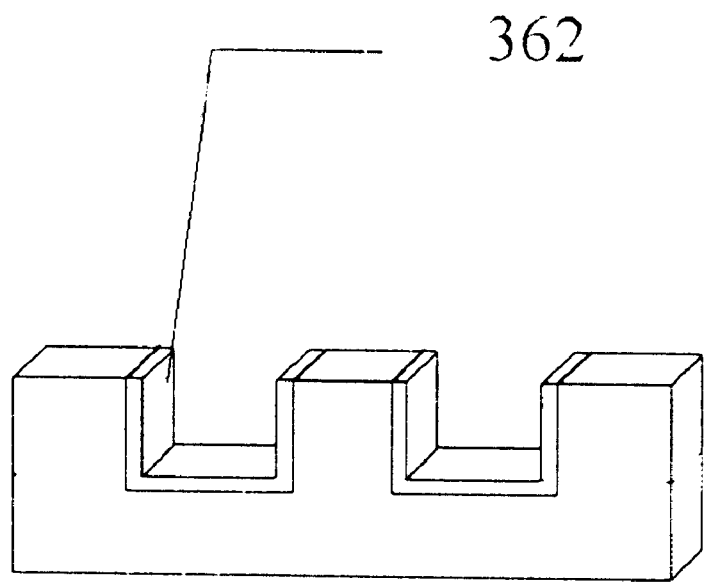
FIG. 6 shows a second version of the grooved partition for supporting the common conducting rails of the LED display panel.

To prevent short circuit between the partitions 21 and rails 23 in FIG. 3 or between the partitions 31 and rails 33 in FIG. 4, the grooves of the partitions are coated with insulating material 361 at the bottom as shown in FIG. 5 or at all sides 362 as shown in FIG. 6.

Figure 7:
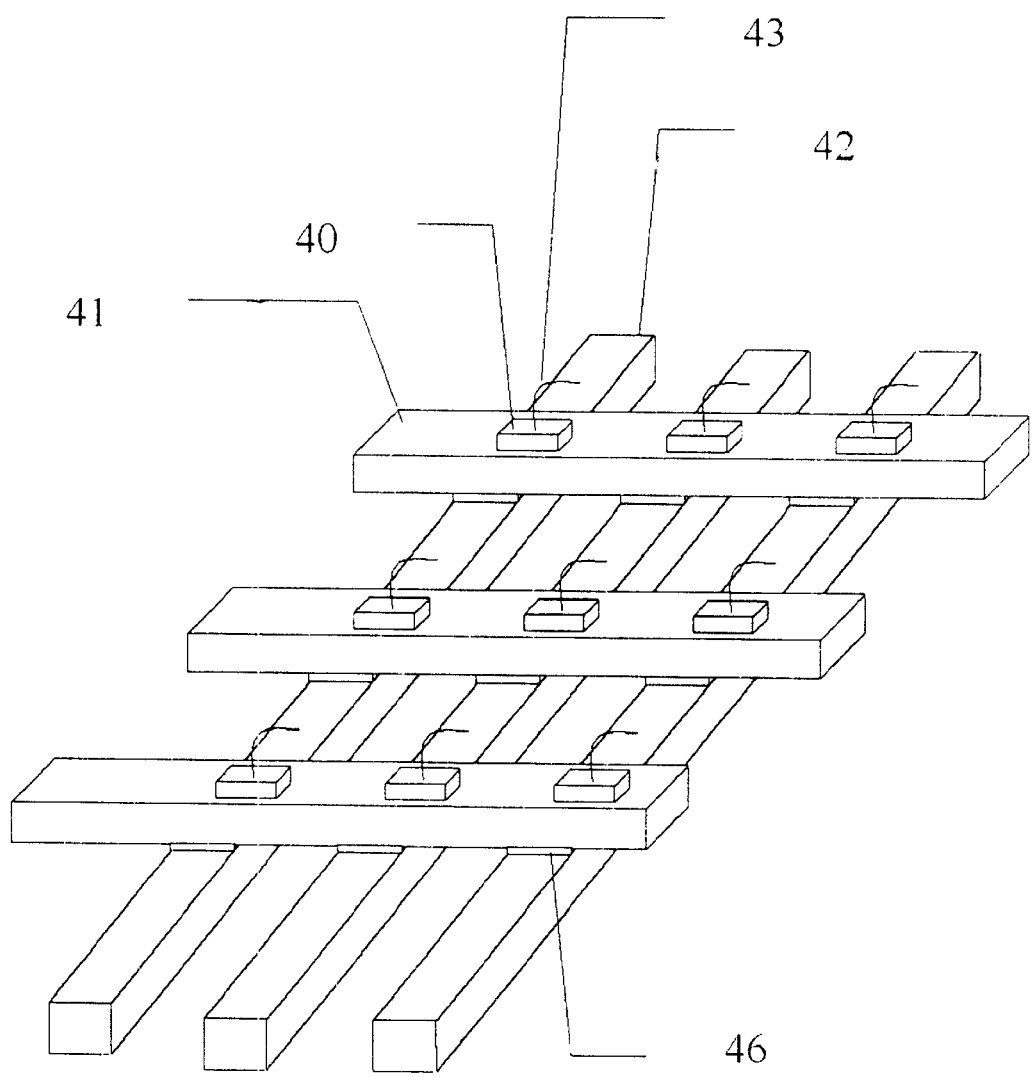
FIG. 7 shows a second embodiment of the LED display panel.

FIG. 7 shows a third embodiment of the present invention. Unlike the corrugated partitions in FIG. 3 or FIG. 4, the metallic partitions 41 are resting on the rails 42. The LEDs 40 are mounted on the metallic partitions 41, which in turn rest on the orthogonal rails 42. The metallic partitions 41 and the rails 42 are insulated from each other with insulators 46. As in FIG. 3 and FIG. 4, the metallic partitions 41 serve as the common bottom electrodes for the LEDs and the heat sink. The top electrodes of the LEDs are wire-bonded to the rail, each serving as a common electrode for a column of LEDs.

Figure 8:
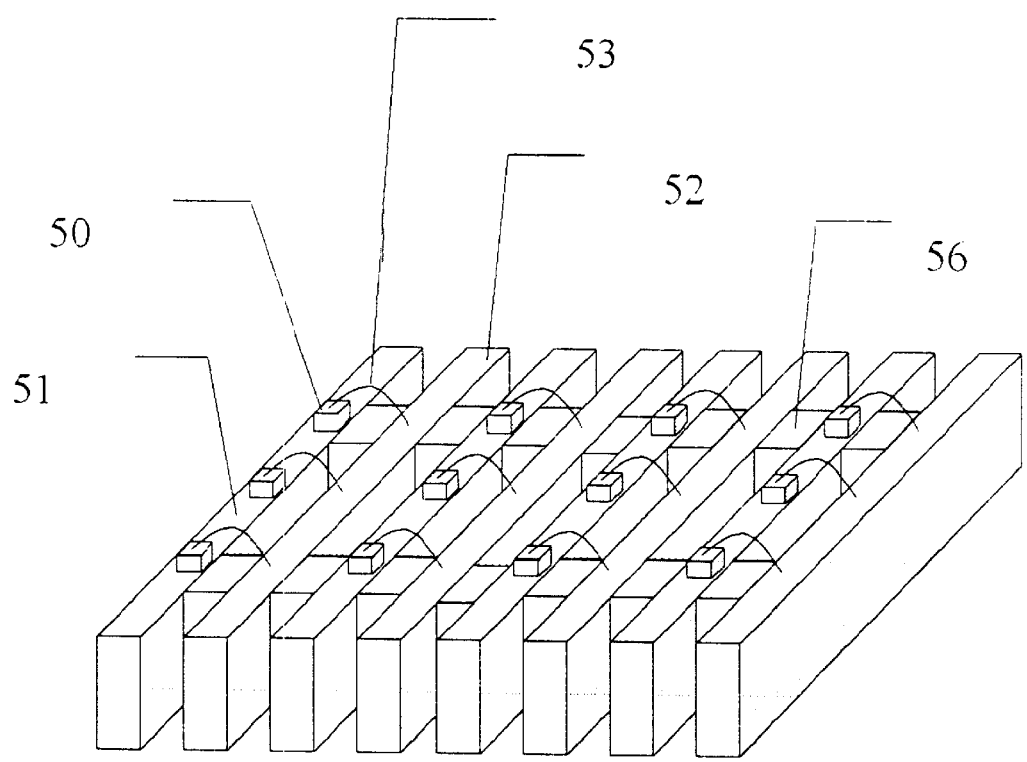
FIG. 8 shows a third embodiment of the LED display panel.

FIG. 8 shows a third embodiment of the present invention. Instead of orthogonal partitions in FIGS. 3, 4 or 7, the partitions 51 are interleaved in parallel with the rails 52. The partitions 51 and the rails 52 are separated by insulators 56. As in the previous embodiments, the LEDs 50 are mounted on the partitions 51 serving as common bottom electrodes as well as a heat sink for a column of LEDs. The top electrodes of the LEDs are wire-bonded by wires 53 to the common rail 52 for a column of LEDs.

Figure 9:
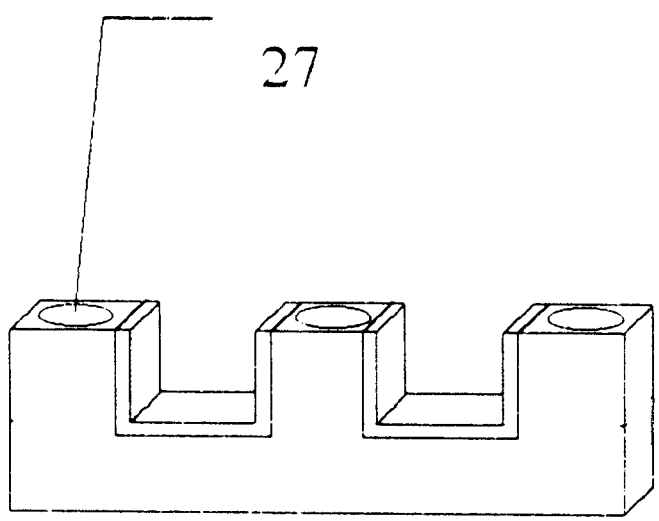
FIG. 9 shows a grooved partition with focusing cups.

FIG. 9 shows another embodiment of the present invention. The top of pedestals in FIGS. 3 and 4 is recessed as a cup 27. The cup focuses the light emitted from the LED to intensify the light in the forward direction.

While particular embodiments of the invention have been described, it will be apparent to those skilled in the art that various modifications may be made in the embodiments without departing from the spirit of the present invention. Such modifications are all within the scope of this invention.

What is claimed is:

1. A light emitting diode (LED) display package, comprising:

a plurality of parallel conducting partitions;

a plurality of parallel conducting rails;

a plurality of LEDs mounted on said plurality of parallel partitions serving as common first electrodes for a group of said LEDs mounted on the same partition of said partition and heat sink; and said plurality of parallel conducting rails connected to the second electrodes of said LEDs serving as a common electrode for a second group of LEDs lined up along said rails, wherein said partitions are grooved and aligned, and said rails are orthogonal to said partitions and anchored in the grooves of said partitions.

2. The LED display package as described in claim 1, wherein said rails are grooved so that the grooves of said rails are locked with the groves of said partitions.

3. The LED display package as described in claim 1, wherein said bottoms of said grooves are lined with insulators.

4. The LED display package as described in claim 1, wherein the sides of said grooves are lined with insulators.

5. The LED display package as described in claim 1, wherein said partitions are mounted orthogonally over and insulated from said rails.

6. The LED display package as described in claim 1, wherein said partitions are placed in parallel, interleaved and insulated with said rails.

7. The LED display package as described in claim 1, wherein said LEDs are recessed in a cup in said partitions for focusing the light emitted from the LEDs.

* * * * *